United States Patent
Punzalan et al.

(10) Patent No.: US 7,443,015 B2
(45) Date of Patent: Oct. 28, 2008

(54) INTEGRATED CIRCUIT PACKAGE SYSTEM WITH DOWNSET LEAD

(75) Inventors: Jeffrey D. Punzalan, Singapore (SG); Sheila Marie L. Alvarez, Singapore (SG); Jose Alvin Caparas, Singapore (SG); Robinson Quiazon, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/381,734

(22) Filed: May 4, 2006

(65) Prior Publication Data
US 2007/0108624 A1    May 17, 2007

Related U.S. Application Data

(60) Provisional application No. 60/594,776, filed on May 5, 2005.

(51) Int. Cl.
*H01L 21/00* (2006.01)

(52) U.S. Cl. ........................................ 257/676; 257/673

(58) Field of Classification Search .......... 257/666–677
See application file for complete search history.

(56) References Cited

U.S. PATENT DOCUMENTS

| | | | | |
|---|---|---|---|---|
| 6,018,189 | A * | 1/2000 | Mizuno | 257/668 |
| 6,580,165 | B1 | 6/2003 | Singh | |
| 6,677,662 | B1 * | 1/2004 | Chung et al. | 257/666 |
| 6,700,187 | B2 * | 3/2004 | Paek | 257/673 |
| 6,750,546 | B1 | 6/2004 | Villanueva et al. | |
| 6,798,667 | B2 | 9/2004 | Chan | |
| 6,864,423 | B2 * | 3/2005 | Tan et al. | 174/536 |
| 6,890,793 | B2 | 5/2005 | Singh | |
| 7,042,068 | B2 * | 5/2006 | Ahn et al. | 257/666 |
| 2002/0020907 | A1 * | 2/2002 | Seo et al. | 257/687 |
| 2005/0139972 | A1 | 6/2005 | Chiu et al. | |
| 2005/0258521 | A1 * | 11/2005 | Park et al. | 257/670 |

* cited by examiner

*Primary Examiner*—Leonardo Andújar
(74) *Attorney, Agent, or Firm*—Mikio Ishimaru

(57) ABSTRACT

An integrated circuit package system includes an integrated circuit package having a downset terminal lead, a planar recessed lead surface of the downset terminal lead, and an attached integrated circuit over the planar recessed lead surface.

13 Claims, 2 Drawing Sheets

INTEGRATED CIRCUIT PACKAGE SYSTEM WITH DOWNSET LEAD

CROSS-REFERENCES TO RELATED APPLICATION(S)

This application claims the benefit of U.S. Provisional Patent Application Ser. No. 60/594,776 filed May 5, 2005, and the subject matter thereof is hereby incorporated herein by reference thereto.

TECHNICAL FIELD

The present invention relates generally to package systems, and more particularly to a system for integrated circuit packages.

BACKGROUND ART

The integrated circuit has become indispensable in our daily life, including food, clothing, lodging, transportation, education, and entertainment. Product assembled using integrated circuit devices can be found everywhere. Sophisticated electronic products continue to be developed that are more user-friendly and have functions that are more complicated. In order to provide improving convenience and usage, product design trends are towards lighter, thinner, shorter, and smaller.

Higher integration can be achieved through chip scale package (CSP) applications such as flip chip technology. Flip chip technology can employ area arrays for bump pads including connections to a carrier, thereby reducing package area and shortening transmission paths. A flip chip is generally a semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, or a silicon substrate. The typical flip chip is generally quite small, resulting in the terminals being crowded along the perimeter. As a result, conductor patterns are typically composed of numerous conductors often spaced closely.

Because of the fine patterns of the terminals and conductor pattern, soldering a flip chip to its conductor pattern requires a significant degree of precision. Reflow solder techniques are widely utilized in the soldering of flip chips. Such techniques typically involve forming solder bumps on the surface of the flip chip. Heating the solder above its melting temperature serves to form the characteristic solder bumps. The chip is then soldered to the conductor pattern by registering the solder bumps with their respective conductors, and reheating, or reflowing, the solder so as to metallurgically and electrically bond the chip to the conductor pattern.

Deposition and reflow of the solder must be precisely controlled not only to coincide with the spacing of the terminals and the size of the conductors, but also to control the height of the solder bumps after soldering. Controlling the height of solder bumps after reflow is necessary in order to provide proper positioning of the chip after reflow. Sufficient spacing between the chip and substrate is necessary for enabling stress relief during thermal cycles, providing electrical isolation, allowing cleaning solutions for removing undesirable residues during manufacturing, and enabling bonding and encapsulation materials between the chip and the substrate.

By properly limiting the degree to which the molten solder can laterally expand during reflow, the height of the solder bumps, and therefore the spacing between chip and substrate, can be closely controlled by depositing an appropriate amount of solder at each terminal location. Packaging processes are still plagued by conventional techniques that cannot closely control the height of a flip chip's solder bumps and suffer from excessive solder wetting, reduced collapse height, poor IC planarity, solder overflow and insufficient lead registration or locking.

Thus, a need still remains for an integrated circuit package system to provide improved package performance and manufacturing including control over solder bump reflow and package encapsulation. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package having a downset terminal lead, forming a planar recessed lead surface of the downset terminal lead, and attaching an integrated circuit over the planar recessed lead surface.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
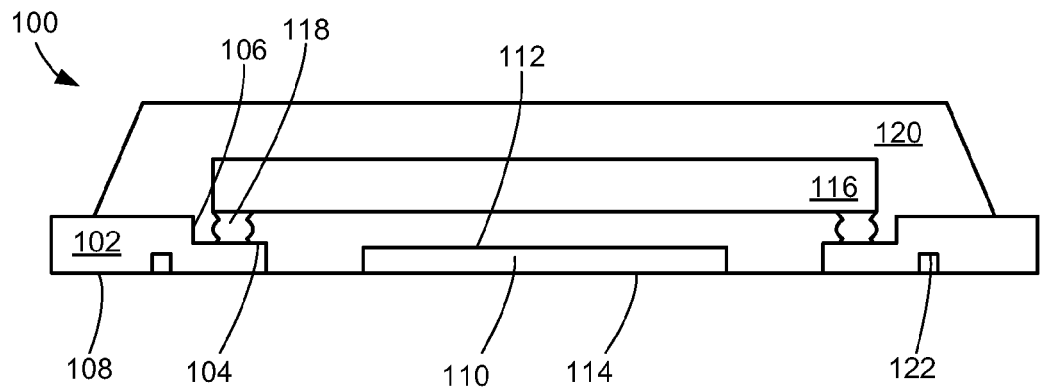
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material, patterning, exposure, development, etching, cleaning, and/or removal of the material or as required in forming a described structure.

Referring now to FIG. 1, therein is shown a cross-sectional view of an integrated circuit package system 100 in an embodiment of the present invention. The integrated circuit package system 100 includes downset terminal leads 102 with a planar recessed lead surface 104, such as a half-etched lead tip. The planar recessed lead surface 104 can be formed at the inner edge of the downset terminal leads 102 on a side of the downset terminal leads 102 opposite a terminal external surface 108. The downset terminal leads 102 include a terminal top wall 106 adjacent the planar recessed lead surface 104 and the terminal external surface 108 substantially planar to a plane of a package bottom surface 114 of the integrated circuit package system 100. The integrated circuit package system 100 also includes a die paddle 110 with a paddle top surface 112 and a paddle bottom surface substantially planar to a plane of the package bottom surface 114. An integrated circuit 116 is mounted over the die paddle 110 with connectors 118, such as solder bumps, on the planar recessed lead surface 104.

The terminal top wall 106 provides a barrier to restrict spreading of the connectors 118 during processing. The planar recessed lead surface 104 also provides a predetermined planar surface for adhesion of the connectors 118 to control wetting and thereby controlling collapse of the connectors 118. Materials forming the connectors 118 also provide cohesion of the connectors 118 to control integrity thereby also controlling collapse of the connectors. The control that is provided by the adhesive forces of the planar recessed lead surface 104 regulates the height of the connectors 118 in addition to cohesive forces of the connectors 118.

An encapsulant 120 covers and protects the integrated circuit 116. The encapsulant also covers the die paddle 110 and partially covers the downset terminal leads 102. A predetermined height of the paddle top surface 112 allows penetration of the encapsulant 120 to eliminate voids. The downset terminal leads 102 have been partially etched, such as a half-etch, to form the planar recessed lead surface 104 and terminal locking features 122. The downset terminal leads 102 can include the terminal locking features 122. The terminal locking features 122 provide positioning and registration of the encapsulant to the package components, such as the downset terminal leads 102 and the integrated circuit 116.

It has been discovered that the planar recessed lead surface 104 significantly improves wetting, collapse height, planarity of the integrated circuit 116, the terminal locking features 122, and eliminates overflow of the connectors 118 on the downset terminal leads 102.

Figure 2:
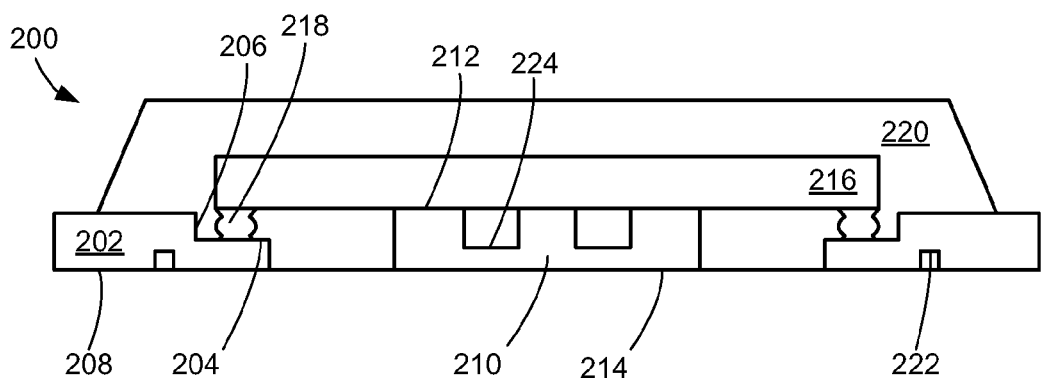
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. In a manner similar to the integrated circuit package system 100, the integrated circuit package system 200 includes downset terminal leads 202 with a planar recessed lead surface 204, such as a half-etched lead tip. The planar recessed lead surface 204 can be formed at the inner edge of the downset terminal leads 202. The downset terminal leads 202 include a terminal top wall 206 and a terminal external surface 208. The integrated circuit package system 200 also includes a die paddle 210 with a paddle top surface 212 and a paddle bottom surface 214. An integrated circuit 216 is mounted over the die paddle 210 with connectors 218, such as solder bumps, on the planar recessed lead surface 204.

The terminal top wall 206 provides a barrier to restrict spreading of the connectors 218 during processing. The planar recessed lead surface 204 also provides a predetermined planar surface for adhesion of the connectors 218 to control wetting and thereby controlling collapse of the connectors 218. Materials forming the connectors 218 also provide cohesion of the connectors 218 to control integrity thereby also controlling collapse of the connectors. The paddle top surface 212 further provides a predetermined height to control the position of the integrated circuit 216 thereby further controlling collapse of the connectors. The control that is provided by the adhesive forces of the planar recessed lead surface 204 regulates the height of the connectors 218 in addition to cohesive forces of the connectors 218 and the height of the paddle top surface 212.

An encapsulant 220 covers and protects the integrated circuit 216. The encapsulant also covers the die paddle 210 and partially covers the downset terminal leads 202. The downset terminal leads 202 have been partially etched, such as a half-etch, to form the planar recessed lead surface 204 and terminal locking features 222. The downset terminal leads 202 can include the terminal locking features 222. The paddle top surface 212 and the paddle bottom surface 214 can also include paddle locking features 224. The terminal locking features 222 and the paddle locking features 224 provide a pathway for penetration, positioning, and registration of the encapsulant 220 to the package components, such as the downset terminal leads 202, the die paddle 210, and the integrated circuit 216.

It has been discovered that the planar recessed lead surface 204 significantly improves wetting, collapse height, planarity of the integrated circuit 216, the terminal locking features 222, and eliminates overflow of the connectors 218 on the downset terminal leads 202.

Figure 3:
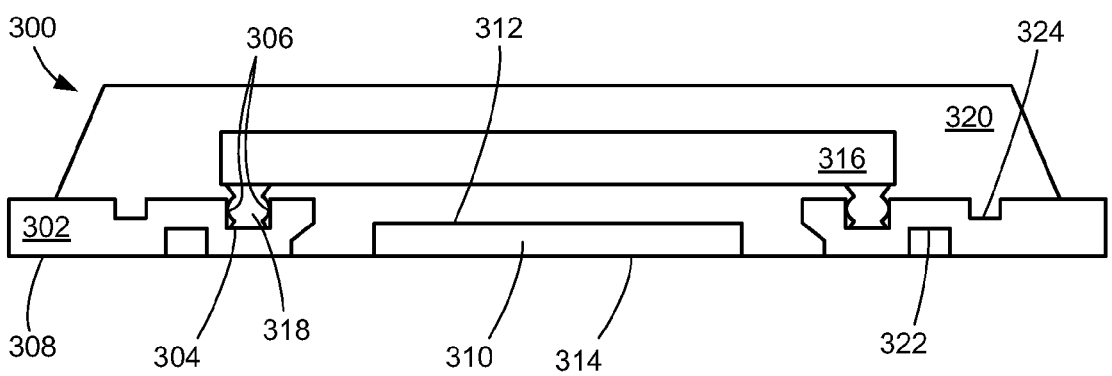
FIG. 3 is a cross-sectional view of an integrated circuit package system in an alternative embodiment of the present invention.

Referring now to FIG. 3, therein is shown a cross-sectional view of an integrated circuit package system 300 in an alternative embodiment of the present invention. In a manner similar to the integrated circuit package system 100, the integrated circuit package system 300 includes downset terminal leads 302 with a planar recessed lead surface 304, such as a half-etched lead tip. The planar recessed lead surface 304 can be formed with a predetermined setback from an inner edge of the downset terminal leads 302. The downset terminal leads 302 include terminal top walls 306 and a terminal external surface 308. The integrated circuit package system 300 also includes a die paddle 310 with a paddle top surface 312 and a paddle bottom surface 314. An integrated circuit 316 is mounted over the die paddle 310 with connectors 318, such as solder bumps, on the planar recessed lead surface 304.

The terminal top walls 306 provide a barrier to restrict spreading of the connectors 318 during processing. The planar recessed lead surface 304 also provides a predetermined planar surface for adhesion of the connectors 318 to control wetting and thereby controlling collapse of the connectors 318. Materials forming the connectors 318 also provide cohesion of the connectors 318 to control integrity thereby also controlling collapse of the connectors. The control that is provided by the adhesive forces of the planar recessed lead surface 304 regulates the height of the connectors 318 in addition to cohesive forces of the connectors 318.

An encapsulant 320 covers and protects the integrated circuit 316. The encapsulant also covers the die paddle 310 and partially covers the downset terminal leads 302. A predetermined height of the paddle top surface 312 allows penetration of the encapsulant 320 to eliminate voids. The downset terminal leads 302 have been partially etched, such as a half-etch, to form the planar recessed lead surface 304 and terminal locking features 322, such as a U-groove on the terminal external surface 308. The terminal locking features 322 also provide a support region of the encapsulant 320 for structural integrity during further processing, such as singulation.

The downset terminal leads 302 include the terminal locking features 322. The terminal locking features 322 provide positioning and registration of the encapsulant to the package components, such as the downset terminal leads 302, and the integrated circuit 316. It has been discovered that the planar recessed lead surface 304 and overflow eliminator features 324 significantly improve wetting, collapse height, planarity of the integrated circuit 316, the terminal locking features 322, and eliminates overflow of the connectors 318 on the downset terminal leads 302.

Figure 4:
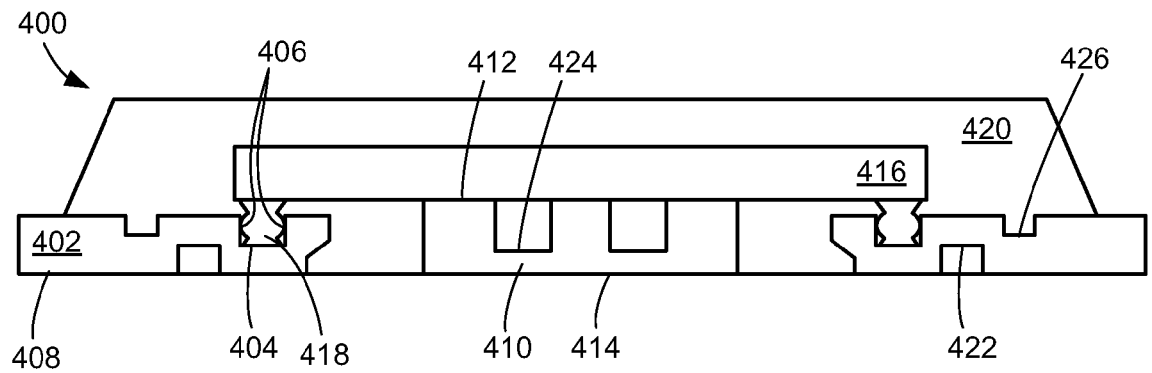
FIG. 4 is a cross-sectional view of an integrated circuit package system in an alternative embodiment of the present invention.

Referring now to FIG. 4, therein is shown a cross-sectional view of an integrated circuit package system 400 in an alternative embodiment of the present invention. In a manner similar to the integrated circuit package system 100, the integrated circuit package system 400 includes downset terminal leads 402 with a planar recessed lead surface 404, such as a half-etched lead tip. The planar recessed lead surface 404 can be formed with a predetermined setback from an inner edge of the downset terminal leads 402. The downset terminal leads 402 include terminal top walls 406 and a terminal external surface 408. The integrated circuit package system 400 also includes a die paddle 410 with a paddle top surface 412 and a paddle bottom surface 414. An integrated circuit 416 is mounted over the die paddle 410 with connectors 418, such as solder bumps, on the planar recessed lead surface 404.

The terminal top walls 406 provide a barrier to restrict spreading of the connectors 418 during processing. The planar recessed lead surface 404 also provides a predetermined planar surface for adhesion of the connectors 418 to control wetting and thereby controlling collapse of the connectors 418. Materials forming the connectors 418 also provide cohesion of the connectors 418 to control integrity thereby also controlling collapse of the connectors. The paddle top surface 412 further provides a predetermined height to control the position of the integrated circuit 416 thereby further controlling collapse of the connectors. The control that is provided by the adhesive forces of the planar recessed lead surface 404 regulates the height of the connectors 418 in addition to cohesive forces of the connectors 418 and the height of the paddle top surface 412.

An encapsulant 420 covers and protects the integrated circuit 416. The encapsulant also covers the die paddle 410 and partially covers the downset terminal leads 402. The downset terminal leads 402 have been partially etched, such as a half-etch, to form the planar recessed lead surface 404 and terminal locking features 422, such as a U-groove on the terminal external surface 408. The terminal locking features 422 also provide a support region of the encapsulant 420 for structural integrity during further processing, such as singulation.

The downset terminal leads 402 include the terminal locking features 422. The paddle top surface 412 and the paddle bottom surface 414 can also include paddle locking features 424. The terminal locking features 422 and the paddle locking features 424 provide a pathway for penetration, positioning, and registration of the encapsulant 420 to the package components, such as the downset terminal leads 402, the die paddle 410, and the integrated circuit 416.

It has been discovered that the planar recessed lead surface 404 and overflow eliminator features 426 significantly improve wetting, collapse height, planarity of the integrated circuit 416, the terminal locking features 422, and eliminates overflow of the connectors 418 on the downset terminal leads 402.

Figure 5:
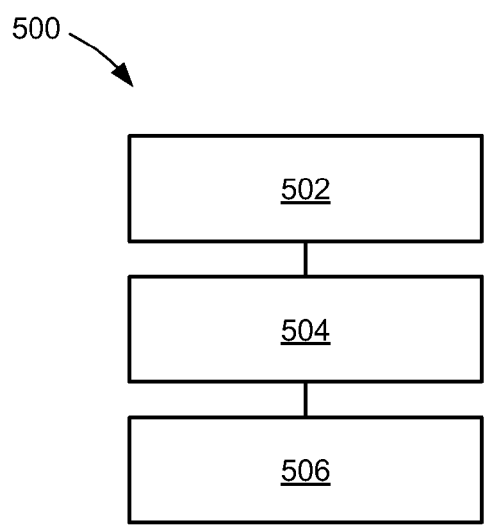
FIG. 5 is a flow chart of an integrated circuit package system for manufacturing the integrated circuit package system in an embodiment of the present invention.

Referring now to FIG. 5 is a flow chart of an integrated circuit package system 500 for manufacturing the integrated circuit package system 100 in an embodiment of the present invention. The system 500 includes providing an integrated circuit package having a downset terminal lead in a block 502; forming a planar recessed lead surface of the downset terminal lead in a block 504; and attaching an integrated circuit over the planar recessed lead surface in a block 506.

In greater detail, a method to fabricate the integrated circuit package system 100, in an embodiment of the present invention, is performed as follows:
1. Providing an integrated circuit package having a downset terminal lead and a downset package paddle. (FIG. 1)
2. Attaching an integrated circuit over a planar recessed lead surface of the downset terminal lead and a recessed package paddle surface of the downset package paddle. (FIG. 1)
3. Connecting an electrical connector between the integrated circuit and the planar recessed lead surface. (FIG. 1)

It has been discovered that the present invention thus has numerous aspects.

An aspect is that the present invention provides the downset terminal leads. The downset terminal leads include the terminal top wall with the planar recessed lead surface. The planar recessed lead surface provides the mounting surface for the connectors of the integrated circuit.

Another aspect is that the present invention provides the die paddle. The die paddle includes the paddle top surface having predetermined height. The integrated circuit is mounted over the paddle top surface.

Another aspect is that the present invention provides the terminal locking features. The terminal top surface can be formed to include the terminal locking features. Similarly, the terminal external surface can also be formed to include the terminal locking features.

Another aspect is that the present invention provides the paddle locking features. The paddle top surface can be formed to include the paddle locking features. Similarly, the paddle bottom surface can also be formed to include the paddle locking features.

It has been discovered that the disclosed structure provides significantly improved regulation of wetting. The planar recess lead surface provides the predetermined planar dimension for the connectors. The wetting of the connectors is regulated by the predetermined planar dimension.

It has also been discovered that the disclosed structure provides significantly improved collapse height. The regulation of the wetting of the connectors reduces collapse of the connectors. Reduced wetting reduces collapse and increased wetting increases collapse to regulate and improve collapse height.

Yet another discovery is that the disclosed structure provides significantly improved terminal locking features. The terminal top surface and the terminal external surface can both include terminal locking features. The terminal locking features provide registration and integrity of the downset terminal leads.

Yet another discovery is that the disclosed structure provides significantly improved paddle locking features. The paddle top surface and the paddle bottom surface can both include paddle locking features. The paddle locking features provide registration and integrity of the die paddle with other package components.

Yet another discovery is that the disclosed structure eliminates overflow of the connectors on the downset terminal leads. The planar recessed lead surface provides the predetermined planar surface for wetting the connectors. Adhesion between the connectors and the planar recessed lead surface constraint the wetting surface to eliminate overflow.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing an integrated circuit package having a downset terminal lead;
   forming a planar recessed lead surface, a terminal external surface, and a terminal top wall of the downset terminal lead, the planar recessed lead surface on a side opposite the terminal external surface, the terminal external surface substantially planar to a plane of a package bottom surface, and the terminal top wall adjacent the planar recessed lead surface, for controlling connector collapse;
   attaching an integrated circuit over the planar recessed lead surface; and
   forming a die paddle having a half-etched region for bump collapse control.

2. The system as claimed in claim 1 wherein forming the planar recessed lead surface comprises forming a half-etched region of the downset terminal lead.

3. The system as claimed in claim 1 further comprising forming a locking feature of the downset terminal lead for encapsulant integrity.

4. The system as claimed in claim 1 further comprising forming a die paddle having a mold locking feature for encapsulant integrity.

5. An integrated circuit package system comprising:
   an integrated circuit package having a downset terminal lead;
   a planar recessed lead surface, a terminal external surface, and a terminal top wall of the downset terminal lead, the planar recessed lead surface on a side opposite the terminal external surface, the terminal external surface substantially planar to a plane of a package bottom surface, and the terminal top wall adjacent the planar recessed lead surface, for controlling connector collapse;
   an integrated circuit over the planar recessed lead surface; and a die paddle having a half-etched region for bump collapse control.

6. The system as claimed in claim 5 wherein the planar recessed lead surface comprises a half-etched region of the downset terminal lead.

7. The system as claimed in claim 5 further comprising a locking feature of the downset terminal lead for encapsulant integrity.

8. The system as claimed in claim 5 further comprising a die paddle having a mold locking feature for encapsulant integrity.

9. The system as claimed in claim 5 wherein:
   the integrated circuit over the planar recessed lead surface of the downset terminal lead and the die paddle; and
   the integrated circuit package having a die paddle and a downset terminal lead including a planar recessed lead surface, a terminal external surface, and a terminal top wall, the planar recessed lead surface on a side opposite the terminal external surface, the terminal external surface substantially coplanar to a plane of a package bottom surface, and the terminal top wall adjacent the planar recessed lead surface, for controlling connector collapse;
   further comprising:
   an electrical connector between the integrated circuit and the planar recessed lead surface.

10. The system as claimed in claim 9 wherein the integrated circuit package comprises a half-etched surface of the die paddle.

11. The system as claimed in claim 9 wherein the integrated circuit package comprises a partially half-etched surface of the die paddle.

12. The system as claimed in claim 9 wherein the integrated circuit package comprises the planar recessed lead surface at an inner edge of the downset terminal lead.

13. The system as claimed in claim 9 wherein the integrated circuit package comprises the planar recessed lead surface with a predetermined setback from an inner edge of the downset terminal leads.

* * * * *